(12) United States Patent
Shionoiri

(10) Patent No.: US 8,441,099 B2
(45) Date of Patent: May 14, 2013

(54) WIRELESS CHIP

(75) Inventor: Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/893,509

(22) Filed: Sep. 29, 2010

(65) Prior Publication Data

US 2011/0012183 A1   Jan. 20, 2011

Related U.S. Application Data

(63) Continuation of application No. 11/661,106, filed as application No. PCT/JP2005/016565 on Sep. 2, 2005, now Pat. No. 7,808,090.

(30) Foreign Application Priority Data

Sep. 9, 2004   (JP) ................................ 2004-263111

(51) Int. Cl.
  *H01L 23/02*   (2006.01)
  *H01L 29/00*   (2006.01)
  *H01L 29/04*   (2006.01)
(52) U.S. Cl.
  USPC .............. 257/532; 257/531; 257/679; 257/72
(58) Field of Classification Search .................... 257/72, 257/296, 531, 532, 679, 922, E27.111, 76, 257/85
See application file for complete search history.

(56) References Cited

U.S. PATENT DOCUMENTS

| | | | |
|---|---|---|---|
| 5,643,804 A | 7/1997 | Arai et al. | |
| 5,686,328 A | 11/1997 | Zhang et al. | |
| 5,814,529 A | 9/1998 | Zhang | |
| 5,877,533 A | 3/1999 | Arai et al. | |
| 6,079,622 A * | 6/2000 | Goto | 235/492 |

(Continued)

FOREIGN PATENT DOCUMENTS

| | | |
|---|---|---|
| EP | 1045447 A | 10/2000 |
| EP | 1 251 558 | 10/2002 |

(Continued)

OTHER PUBLICATIONS

International Search Report (Application No. PCT/JP2005/016565) dated Dec. 6, 2005.

(Continued)

*Primary Examiner* — Shouxiang Hu
(74) *Attorney, Agent, or Firm* — Eric J. Robinson; Robinson Intellectual Property Law Office, P.C.

(57) ABSTRACT

An ID tag capable of communicating data wirelessly, the size of which is reduced, and where the size of an IC chip is reduced, a limited area of the chip is effectively used, current consumption is reduced, and communication distance is prevented from decreasing. The ID tag of the invention includes an IC chip having an integrated circuit, a resonance capacitor portion and a storage capacitor portion, and an antenna formed over the IC chip so as to overlap at least partially with an insulating film interposed therebetween. The antenna, the insulating film and wirings or semiconductor films forming the integrated circuit are stacked, and one or both of capacitors in the resonance capacitor portion and the storage capacitor portion are formed by this stacked structure.

12 Claims, 15 Drawing Sheets

U.S. PATENT DOCUMENTS

| | | |
|---|---|---|
| 6,320,224 B1 | 11/2001 | Zhang |
| 6,410,960 B1 | 6/2002 | Arai et al. |
| 6,498,369 B1 * | 12/2002 | Yamazaki et al. ............ 257/347 |
| 6,518,887 B2 * | 2/2003 | Suzuki et al. .............. 340/572.8 |
| 6,639,299 B2 | 10/2003 | Aoki |
| 6,646,288 B2 | 11/2003 | Yamazaki et al. |
| 6,700,796 B2 | 3/2004 | Detcheverry et al. |
| 6,838,773 B2 | 1/2005 | Kikuchi et al. |
| 6,853,286 B2 | 2/2005 | Nikawa et al. |
| 6,942,158 B2 * | 9/2005 | Waters .......................... 235/492 |
| 7,015,479 B2 * | 3/2006 | Haas et al. ............... 250/370.11 |
| 7,271,076 B2 | 9/2007 | Yamazaki et al. |
| 7,319,633 B2 | 1/2008 | Shionoiri et al. |
| 7,408,196 B2 | 8/2008 | Kurokawa |
| 7,517,738 B2 | 4/2009 | Zhang |
| 7,518,692 B2 | 4/2009 | Yamazaki et al. |
| 7,521,368 B2 | 4/2009 | Yamaguchi et al. |
| 7,663,473 B2 | 2/2010 | Koyama |
| 2004/0124983 A1 * | 7/2004 | Kuroda et al. ............. 340/572.1 |

FOREIGN PATENT DOCUMENTS

| | | | |
|---|---|---|---|
| EP | 1262932 A | | 12/2002 |
| EP | 1 359 618 | | 11/2003 |
| EP | 1437683 A | | 7/2004 |
| EP | 2410567 A | | 1/2012 |
| JP | 06-333740 A | | 12/1994 |
| JP | 07-140485 A | | 6/1995 |
| JP | 08-255875 | | 10/1996 |
| JP | 2001118040 A | * | 4/2001 |
| JP | 2001-195010 A | | 7/2001 |
| JP | 2001-237276 | | 8/2001 |
| JP | 2001-260580 | | 9/2001 |
| JP | 2002-049903 | | 2/2002 |
| JP | 2002-216093 | | 8/2002 |
| JP | 2002-314028 | | 10/2002 |
| JP | 2003-016412 | | 1/2003 |
| JP | 2003-078023 | | 3/2003 |
| JP | 2004-120188 | | 4/2004 |
| JP | 2004-220591 A | | 8/2004 |
| JP | 2004-227081 | | 8/2004 |
| JP | 2005-056221 | | 3/2005 |
| JP | 2005-203079 | | 7/2005 |
| KR | 2004-0060797 A | | 7/2004 |
| TW | 518637 | | 1/2003 |
| TW | 580640 | | 3/2004 |

OTHER PUBLICATIONS

Written Opinion (Application No. PCT/JP2005/016565) dated Dec. 6, 2005.

Taiwanese Office Action (Application No. 094130551) Dated Jan. 13, 2012.

Korean Office Action (Application No. 2007-7007128) Dated Apr. 30, 2012.

* cited by examiner

PRIOR ART

FIG.9A  —Prior Art—
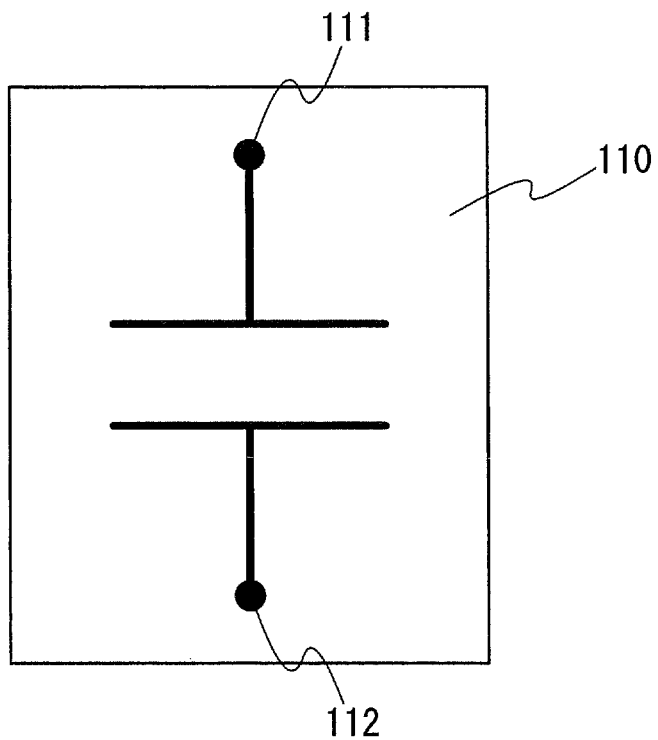
FIG.9B  —Prior Art—
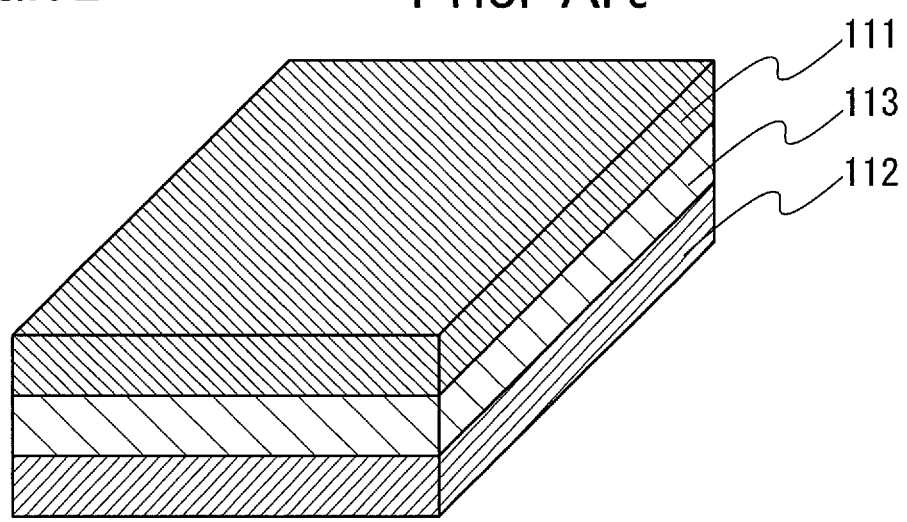

FIG. 12A
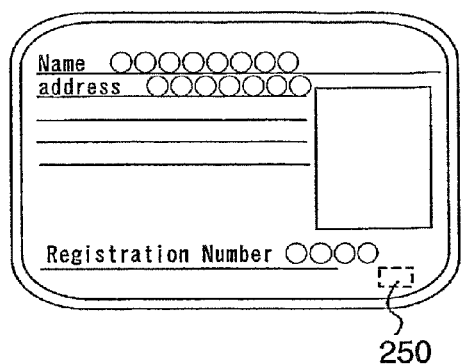
FIG. 12B
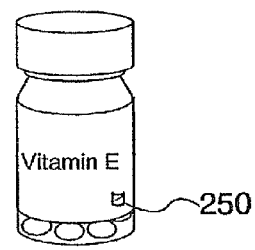
FIG. 12C
FIG. 12D
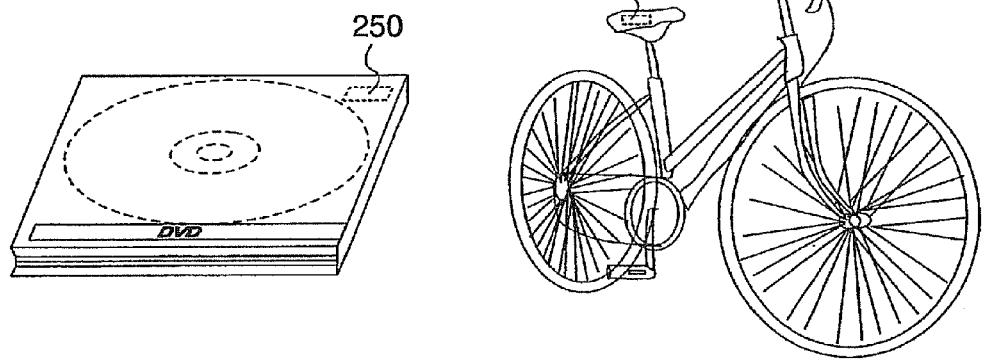
FIG. 12E
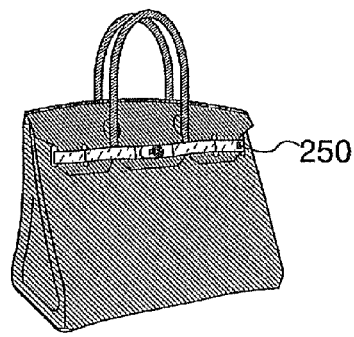

WIRELESS CHIP

TECHNICAL FIELD

The present invention relates to a wireless chip capable of communicating data wirelessly.

BACKGROUND ART

In recent years, with the spread of the Internet, IT (Information Technology) has spread all over the world and revolutionized society. Particularly recently, an environment where the network can be accessed anytime and anywhere has been developed as is called a ubiquitous information society. In such an environment, individual identification systems attract attention, where ID (identification number) is assigned to each object so that the history thereof is revealed and utilized in production, management and the like. Specifically, RFID (Radio Frequency Identification) such as a wireless chip (also called an ID tag, an IC tag, an IC chip, a RF (Radio Frequency) tag, a wireless tag, and an electronic tag) is beginning to be introduced in companies, markets and the like on a trial basis.

In general, a wireless chip 100 is constituted by an antenna 101 and an IC chip 102 as shown in FIG. 8A. The antenna 101 and the IC chip 102 are often formed separately and then attached to be electrically connected to each other.

The IC chip 102 mainly includes a power supply generating means 103, a control means 104, a memory means 105, and a resonance capacitor portion 106 (FIG. 8B). The power supply generating means 103 rectifies and smoothes an AC signal received by an antenna, so that a DC voltage is generated. The power supply generating means 103 includes a capacitor called a storage capacitor portion 107 for holding charges after an AC signal is rectified and smoothed. The control means 104 extracts a data signal, a clock signal and the like from the AC signal received by the antenna, and transmits a modified AC signal from the antenna. The memory means 105 stores semiconductor device-specific ID data. The resonance capacitor portion 106 is provided in order that an AC signal with a predetermined frequency is received most effectively.

FIGS. 9A and 9B are schematic views of a capacitor 110. The capacitor 110 has a first electrode 111 and a second electrode 112 and the two electrodes are provided with an insulating film interposed therebetween (FIG. 9A). In a general capacitor, one electrode (e.g., the first electrode 111) is formed using a wiring or a semiconductor conductive film of an integrated circuit configuring a logic portion of a power supply generating means, a control means, a memory means or the like, while the other electrode (e.g., the second electrode 112) is formed using another wiring or semiconductor conductive film. The two electrodes are provided with an insulating film 113 interposed therebetween (FIG. 9B).

DISCLOSURE OF INVENTION

Generally in a wireless chip, an antenna and an IC chip are disposed so as not to overlap each other, since there is fear that an integrated circuit included in the IC chip may malfunction if the antenna and the IC chip are disposed to overlap each other. If the antenna and the IC chip are disposed so as not to overlap each other, however, a large area of the wireless chip is occupied by the antenna and the IC chip. Therefore, magnetic flux due to electromagnetic induction does not pass easily even when, for example, a coil antenna is provided. Further, when capacitors in a storage capacitor portion, a resonance capacitor portion and the like occupy a large area, the size of the IC chip increases, leading to increased size of the wireless chip itself.

In addition, in the aforementioned case where the wireless chip or the IC chip is large in size, the amount of current required for circuit operation increases. As a result, current consumption increases and the voltage of a power supply may drop, leading to a shorter communication distance and incapability of communication.

In view of the foregoing, an object of the invention is to provide a wireless chip capable of communicating data wirelessly, the size of which is reduced. A further object of the invention is to reduce the size of an IC chip in the wireless chip, make effective use of a limited area of the chip, reduce current consumption, and prevent communication distance from decreasing.

In order to solve the aforementioned problems, the invention provides a wireless chip having the following configurations.

A wireless chip of the invention includes an IC chip provided with a capacitor, and an antenna formed over the IC chip so as to overlap the IC chip at least partially with an insulating film interposed therebetween. The antenna is used as one of two electrodes of the capacitor. In the invention, the capacitor included in the IC chip is disposed in the overlapping area of the IC chip and the antenna. The capacitor may be selectively provided in the overlapping area of the IC chip and the antenna.

A wireless chip of the invention having another configuration includes an IC chip having an integrated circuit, a resonance capacitor portion and a storage capacitor portion, and an antenna formed over the IC chip so as to overlap the IC chip at least partially with an insulating film interposed therebetween. The integrated circuit includes at least a semiconductor film having an impurity region, a gate electrode formed over the semiconductor film with a gate insulating film interposed therebetween, an interlayer insulating film formed so as to cover the gate electrode, and a source or drain electrode formed over the interlayer insulating film. Capacitance of one or both of the resonance capacitor portion and the storage capacitor portion is formed by a stacked structure of a wiring formed over the interlayer insulating film, an insulating film formed to cover the wiring, and the antenna. The wiring may be formed using the same material as the source or drain electrode and may be electrically connected to the source or drain electrode. In the invention, it is preferable that the resonance capacitor portion and the storage capacitor portion included in the IC chip are disposed in the overlapping area of the IC chip and the antenna, and the integrated circuit is disposed in the non-overlapping area. Note that the capacitance of the resonance capacitor portion holds charges generated by connecting the antenna and the capacitance of the resonance capacitor portion in parallel and by resonating each other.

According to the aforementioned configuration of the invention, a wiring is formed over the gate insulating film, and capacitance of one or both of the resonance capacitor portion and the storage capacitor portion is formed by a stacked structure of the wiring formed over the gate insulating film, the interlayer insulating film, the insulating film, and the antenna. In that case, the wiring may be formed using the same material as the gate electrode and may be electrically connected to the gate electrode.

Further, according to the aforementioned configuration of the invention, a wiring is formed over an insulating surface, and capacitance of one or both of the resonance capacitor portion and the storage capacitor portion is formed by a stacked structure of the wiring formed over the insulating surface, the gate insulating film, the interlayer insulating film, the insulating film, and the antenna. In that case, the wiring (also referred to as a semiconductor conductive film) may be formed using the same material as the impurity region of the semiconductor film.

A wireless chip of the invention having another configuration includes an IC chip having a resonance capacitor portion and a storage capacitor portion, and an antenna formed over the IC chip so as to overlap the IC chip at least partially with an insulating film interposed therebetween. The resonance capacitor portion and the storage capacitor portion are disposed so as to overlap each other. The antenna is used as one of two electrodes of a capacitor provided in the resonance capacitor portion, while the other electrode is used as one electrode of a capacitor provided in the storage capacitor portion. Note that the resonance capacitor portion and the storage capacitor portion are only required to overlap each other partially.

A wireless chip of the invention having another configuration includes an IC chip having an integrated circuit, a resonance capacitor portion and a storage capacitor portion, and an antenna formed over the IC chip so as to overlap the IC chip at least partially with an insulating film interposed therebetween. The integrated circuit includes at least a semiconductor film having an impurity region, a gate electrode formed over the semiconductor film with a gate insulating film interposed therebetween, an interlayer insulating film formed to cover the gate electrode, a source or drain electrode formed over the interlayer insulating film, and an insulating film formed to cover the source or drain electrode. The resonance capacitor portion and the storage capacitor portion are disposed so as to overlap each other. Capacitance of the storage capacitor portion is formed by a stacked structure of a first wiring provided over the gate insulating film, the interlayer insulating film, and a second wiring provided over the interlayer insulating film, while capacitance of the resonance capacitor portion is formed by a stacked structure of the second wiring, the insulating film and the antenna. The first wiring may be formed using the same material as the gate electrode and may be electrically connected to the gate electrode. The second wiring may be formed using the same material as the source or drain electrode and may be electrically connected to the source or drain electrode.

A wireless chip of the invention having another configuration includes an IC chip having an integrated circuit, a resonance capacitor portion and a storage capacitor portion, and an antenna formed over the IC chip so as to overlap the IC chip at least partially with an insulating film interposed therebetween. The integrated circuit includes at least a semiconductor film having an impurity region formed over an insulating surface, a gate electrode formed over the semiconductor film with a gate insulating film interposed therebetween, an interlayer insulating film formed to cover the gate electrode, and a source or drain electrode formed over the interlayer insulating film. The resonance capacitor portion and the storage capacitor portion are disposed so as to overlap each other. Capacitance of the storage capacitor portion is formed by a stacked structure of a first wiring formed over the insulating surface, the gate insulating film, the interlayer insulating film, and a second wiring formed over the interlayer insulating film, while capacitance of the resonance capacitor portion is formed by a stacked structure of the second wiring, the insulating film and the antenna. The first wiring may be formed using the same material as the impurity region of the semiconductor film. The second wiring may be formed using the same material as the source or drain electrode and may be electrically connected to the source or drain electrode.

The wireless chip according to the invention includes all devices capable of communicating data wirelessly, such as an IC tag, a RF tag, a wireless tag, and an electronic tag.

According to the invention, an antenna and an IC chip are integrated so as to overlap each other, and the antenna is used as one of two electrodes of a storage capacitor, a resonance capacitor or the like included in the IC chip. Accordingly, the size of a wireless chip and the IC chip can be reduced, leading to effective use of a limited area of the chip, reduction in current consumption, and prevention of decrease in communication distance.

BRIEF DESCRIPTION OF THE DRAWINGS

FIGS. 9A and 9B are diagrams each showing a configuration of a capacitor.
FIGS. 12A to 12E are diagrams each showing an object incorporating a wireless chip according to the invention.

BEST MODE FOR CARRYING OUT THE INVENTION

Figure 1A:
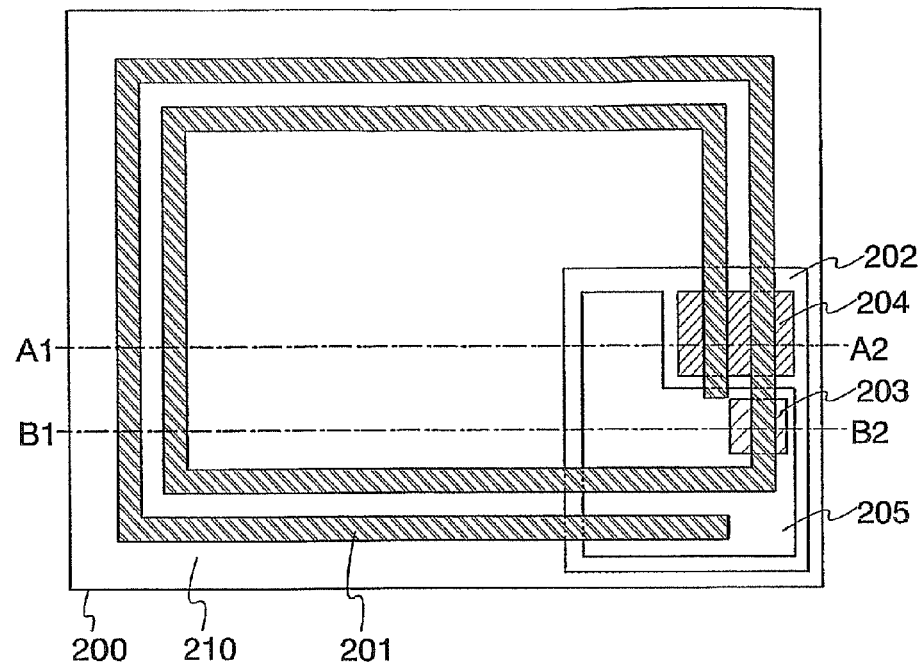
FIGS. 1A to 1C are diagrams each showing a configuration of a wireless chip according to the invention.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. Note that in the following description of the invention, the same portion is denoted by the same reference numeral in different drawings.

Embodiment Mode 1

In this embodiment mode, a configuration example of a wireless chip according to the invention is described with reference to drawings.

As shown in FIG. 1A, a wireless chip 200 shown in this embodiment mode includes an antenna 201 and an IC chip 202 that are stacked over the same substrate 210. The antenna 201 and the IC chip 202 are disposed so as to overlap each other at least partially with an insulating film interposed therebetween. The IC chip 202 includes a resonance capacitor portion 204 and a logic portion 205 having a power supply generating means, a control means, a memory means and the like. The logic portion 205 also has a storage capacitor portion 203. Note that the resonance capacitor portion 204 and the storage capacitor portion 203 are selectively disposed in the overlapping area of the antenna 201 and the IC chip 202. The two terminals of the antenna 201 are electrically connected to an integrated circuit of the logic portion 205.

Each of capacitors provided in the storage capacitor portion 203, the resonance capacitor portion 204 and the like has two electrodes with an insulating film interposed therebetween. In this embodiment mode, the antenna 201 is provided as one electrode of each capacitor in the storage capacitor portion 203 or the resonance capacitor portion 204. That is to say, the antenna 201 provided in an area where the capacitor in the storage capacitor portion 203 or the resonance capacitor portion 204 is provided is used as one electrode of the capacitor. Described below with reference to drawings are a case where the antenna is used as one electrode of the capacitor in the resonance capacitor portion 204, and a case where the antenna is used as one electrode of the capacitor in the storage capacitor portion 203.

Figure 1B:
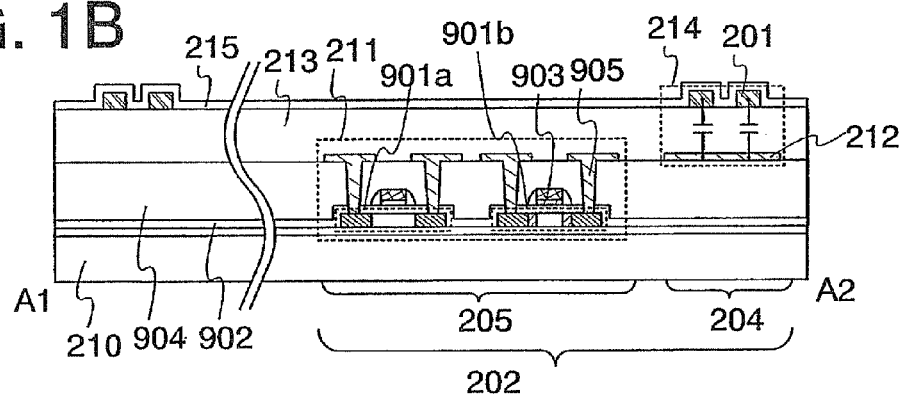

FIG. 1B is a cross sectional view of the resonance capacitor portion 204, where an integrated circuit 211 configuring the logic portion 205, the resonance capacitor portion 204 and the antenna 201 are provided over the substrate 210. Note that FIG. 1B corresponds to a cross section taken along a line A1-A2 of the wireless chip 200 shown in FIG. 1A.

The integrated circuit 211 includes semiconductor films 901a and 901b each having an impurity region, a gate electrode 903 formed over the semiconductor films 901a and 901b with a gate insulating film 902 interposed therebetween, a first interlayer insulating film 904 formed to cover the gate electrode 903, and a source or drain electrode 905 formed over the first interlayer insulating film 904 and electrically connected to the impurity regions of the semiconductor films 901a and 901b.

The resonance capacitor portion 204 includes a wiring 212 and the antenna 201 that are formed with a second interlayer insulating film 213 interposed therebetween. In this manner, capacitance of a capacitor 214 in the resonance capacitor portion 204 is formed by a stacked structure of the wiring 212, the second interlayer insulating film 213 and the antenna 201. That is to say, in this embodiment mode, the antenna 201 is used as one of two electrodes of the capacitor 214, while the wiring 212 is used as the other electrode. In that case, the second interlayer insulating film 213 is preferably formed thin to increase the capacitance.

A manufacturing method of the aforementioned configuration is briefly described below.

First, the substrate 210 is prepared. As the substrate 210, a glass substrate such as barium borosilicate glass and alumino borosilicate glass, a quartz substrate, a ceramic substrate and the like may be used for example. Alternatively, a metal substrate including stainless steel or a semiconductor substrate having a surface provided with an insulating film may be employed as well. A substrate formed of a flexible synthetic resin such as plastic generally has a lower resistance temperature as compared to the aforementioned substrates, though it may be used as long as being resistant to a processing temperature during manufacturing steps. Note that the surface of the substrate 210 may be planarized by polishing such as a CMP method.

Then, the integrated circuit 211 configuring the logic portion 205 is formed over the substrate 210 by a known method. The integrated circuit 211 has at least the semiconductor films 901a and 901b, the gate electrode 903 formed over the semiconductor films 901a and 901b with the gate insulating film 902 interposed therebetween, the first interlayer insulating film 904 formed to cover the gate electrode 903, and the source or drain electrode 905 formed over the first interlayer insulating film 904.

The semiconductor films 901a and 901b may have any state selected from an amorphous semiconductor, an SAS where an amorphous state and a crystalline state are mixed, a microcrystalline semiconductor where a crystal grain with a size of 0.5 to 20 nm can be observed, and a crystalline semiconductor. In this embodiment mode, an amorphous semiconductor film is formed and crystallized by heat treatment to obtain a crystalline semiconductor film. The heat treatment can be performed by using a furnace, laser irradiation, irradiation of light emitted from a lamp instead of laser light (lamp annealing), or a combination of them.

Subsequently, the gate insulating film 902 is formed to cover the semiconductor films 901a and 901b. The gate insulating film 902 may be formed by a single layer or stacked layers using, for example, silicon oxide, silicon nitride, silicon nitride oxide or the like. The deposition may be performed by a plasma CVD method, a sputtering method or the like.

Then, the gate electrode 903 is formed over each of the semiconductor films 901a and 901b with the gate insulating film 902 interposed therebetween. The gate electrode 903 may be formed by a single layer or by stacking a plurality of metal films. The gate electrode 903 may be formed by a CVD method or a sputtering method using an element selected from tantalum (Ta), tungsten (W), titanium (Ti), molybdenum (Mo), aluminum (Al), copper (Cu), chromium (Cr), and neodymium (Nd), or an alloy material or a compound material mainly containing these elements. In this embodiment mode, a first conductive layer and a second conductive layer are stacked in this order using tantalum nitride (TaN) and tungsten (W) respectively.

Then, impurities imparting N-type or P-type conductivity are selectively added to the semiconductor films 901a and 901b using as a mask which the gate electrode 903 or a resist that has been patterned. Each of the semiconductor films 901a and 901b has a channel forming region and impurity regions (including a source region, a drain region and an LDD region), and an N-channel TFT or a P-channel TFT can be obtained depending on the conductivity of the added impurity elements.

In FIG. 1B, side walls are formed at each side of the gate electrode 903. The semiconductor film 901b of an N-channel TFT is selectively added with impurities imparting N-type conductivity to form a source region, a drain region and an LDD region. Meanwhile, the semiconductor film 901a of a P-channel TFT is selectively added with impurities imparting P-type conductivity to form a source region and a drain region are formed. In this embodiment mode, the side walls are formed at each side of the gate electrode 903 and the LDD region is selectively formed in the N-channel TFT, though the invention is not limited to this structure. The LDD region may also be formed in the P-channel TFT, and the side wall is not necessarily formed in the P-channel TFT. Alternatively, a CMOS structure where an N-channel TFT and a P-channel TFT are used in a complementary manner may be adopted as well.

Subsequently, the first interlayer insulating film 904 is formed to cover the gate electrode 903. The first interlayer insulating film 904 may be formed of a single layer or stacked layers of an insulating film containing oxygen or nitrogen such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2, . . . ). It is also possible to use a resin material such as epoxy resin, acrylic resin, phenol resin, novolac resin, melamine resin, urethane resin, and silicone resin. Alternatively, the first interlayer insulating film 904 may be formed using an organic material such as benzocyclobutene, parylene, flare, and polyimide, a compound material obtained by polymerization such as siloxane based polymer, a composition material containing water-soluble homopolymer and water-soluble copolymer, and the like.

The source or drain electrode 905 is formed over the first interlayer insulating film 904. The source or drain electrode 905 is electrically connected to the impurity regions of the semiconductor films 901a and 901b. In FIG. 1B, the wiring 212 is formed using the same material as the source or drain electrode 905. The source or drain electrode 905 and the wiring 212 may be formed of a single layer or stacked layers by a CVD method or a sputtering method, using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material mainly containing these elements. The alloy material mainly containing aluminum is, for example, a material that contains aluminum as a main component and contains nickel, or an alloy material that contains aluminum as a main component and contains nickel and one or both of carbon and silicon. The source or drain electrode 905 and the wiring 212 may be formed using, for example, stacked layers of a barrier film, an aluminum silicon (Al—Si) film and a barrier film, or a barrier film, an aluminum silicon (Al—Si) film, a titanium nitride (TiN) film, and a barrier film. Note that the barrier film is a thin film containing titanium, nitride of titanium, molybdenum, or nitride of molybdenum. Aluminum and aluminum silicon have a low resistance value and are inexpensive; therefore, they are suitable for the source or drain electrode 905 and the wiring 212. When the barrier films are formed on the top layer and the bottom layer, hillock formation in aluminum and aluminum silicon can be prevented. If the barrier film is formed of titanium that is a highly reducing element, even when a thin natural oxide film is formed on a crystalline semiconductor film, the natural oxide film can be oxidized and contact with the crystalline semiconductor film can be improved.

Subsequently, the second interlayer insulating film 213 is formed to cover the source or drain electrode 905 and the wiring 212. The second interlayer insulating film 213 may be formed using any of the aforementioned materials for the first interlayer insulating film.

Then, the antenna 201 is formed over the second interlayer insulating film 213, over which a protective film 215 is formed; thereby the wireless chip is completed. The antenna 201 is formed of a single layer or stacked layers using a conductive material by a CVD method, a sputtering method, a screen printing method, a droplet discharge method or the like. The conductive material is an element selected from aluminum (Al), titanium (Ti), silver (Ag), copper (Cu), gold (Au), and nickel (Ni), or an alloy material or a compound material mainly containing these elements. The protective film 215 may be formed using any of the aforementioned materials for the first interlayer insulating film. Note that in FIG. 1B, the coil antenna 201 wound twice is used as one electrode of the capacitor 214 in the resonance capacitor portion 204, though the invention is not limited to this and an antenna wound once or a plurality of times may be used as one electrode of the capacitor 214.

Described next is a case where the antenna is used as one of the two electrodes of the capacitor in the storage capacitor portion 203.

Figure 1C:
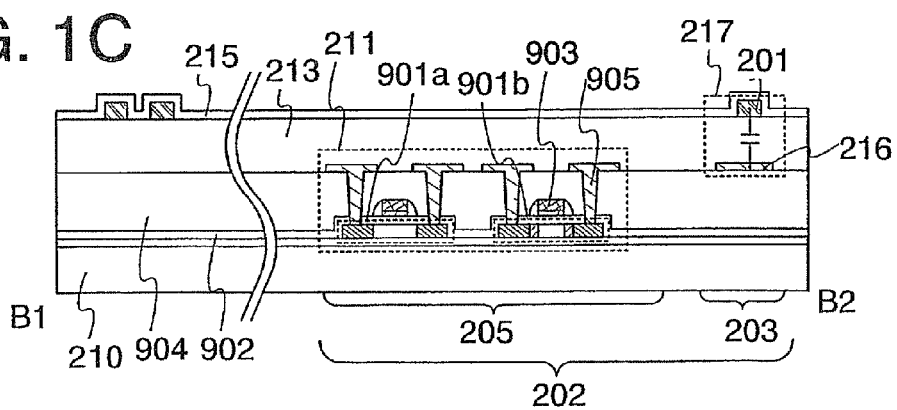

FIG. 1C is a cross sectional view of the storage capacitor portion 203, where the integrated circuit 211 configuring the logic portion 205, the storage capacitor portion 203 and the antenna 201 are provided over the substrate 210. Note that FIG. 1C corresponds to a cross section taken along a line B1-B2 of the wireless chip 200 shown in FIG. 1A.

As set forth above, the integrated circuit 211 includes the semiconductor films 901a and 901b each having an impurity region, the gate electrode 903 formed over the semiconductor films 901a and 901b with the gate insulating film 902 interposed therebetween, the first interlayer insulating film 904 formed to cover the gate electrode 903, and the source or drain electrode 905 formed over the first interlayer insulating film 904 and electrically connected to the impurity regions of the semiconductor films 901a and 901b.

In the storage capacitor portion 203, the antenna 201 and a wiring 216 formed using the same material as the source or drain electrode 905 configuring the integrated circuit are formed with the second interlayer insulating film 213 interposed therebetween. Capacitance of a capacitor 217 in the storage capacitor portion 203 is formed by a stacked structure of the wiring 216, the second interlayer insulating film 213 and the antenna 201. That is to say, in this embodiment mode, the antenna 201 is used as one of two electrodes of the capacitor 217, while the wiring 216 is used as the other electrode.

The storage capacitor portion 203 may be formed in the same manner as the aforementioned resonance capacitor portion 204. Note that in FIG. 1C, the coil antenna 201 wound once is used as one electrode of the capacitor 217 in the storage capacitor portion 203, though the invention is not limited to this and an antenna wound a plurality of times may be used as one electrode of the capacitor 217.

Figure 2A:
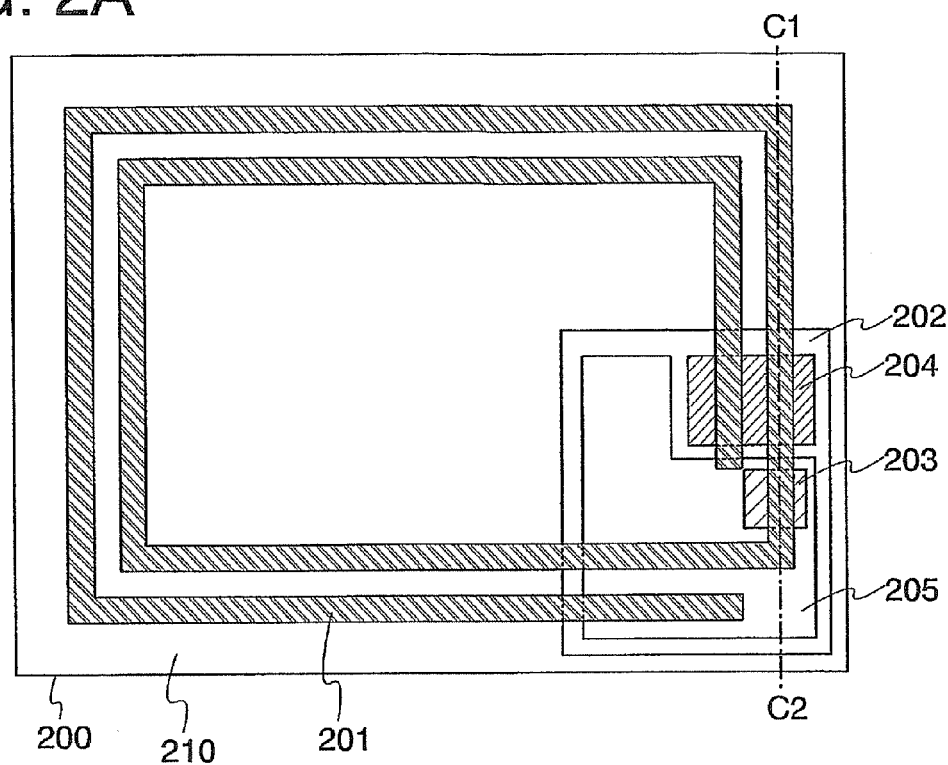
FIGS. 2A and 2B are diagrams each showing a configuration of a wireless chip according to the invention.
Figure 2B:
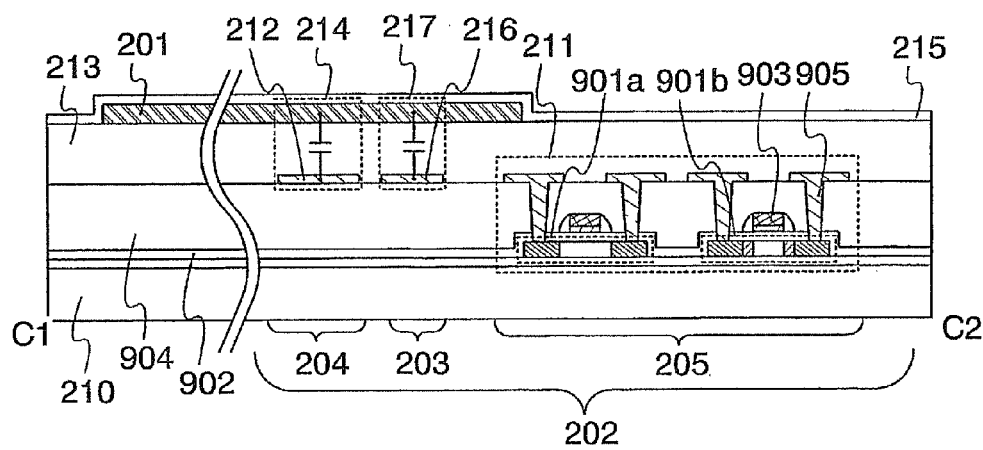

In this embodiment mode, the antenna is used as one of the two electrodes of each of the capacitors in the storage capacitor portion 203, the resonance capacitor portion 204 and the like that are included in the IC chip 202. In that case, the aforementioned configuration may be adopted for one or both of the capacitors in the storage capacitor portion 203 and the resonance capacitor portion 204. FIGS. 2A and 2B show a case where the aforementioned configuration is adopted for both of the capacitors in the storage capacitor portion 203 and the resonance capacitor portion 204.

FIG. 2B is a cross sectional view of the storage capacitor portion 203 and the resonance capacitor portion 204, where the integrated circuit 211 configuring the logic portion 205, the storage capacitor portion 203, the resonance capacitor portion 204, and the antenna 201 are provided over the substrate 210. Note that FIG. 2B corresponds to a cross section taken along a line C1-C2 of the wireless chip 200 shown in FIG. 2A.

In FIGS. 2A and 2B, the antenna 201 is provided as one common electrode of each of the capacitors in the resonance capacitor portion 204 and the storage capacitor portion 203. The wiring 212 is provided as the other electrode of the capacitor 214 in the resonance capacitor portion 204, and the wiring 216 is provided as the other electrode of the capacitor 217 in the storage capacitor portion 203.

In this manner, capacitance of the capacitors 214 and 217 can be formed by stacking the wirings 212 and 216, the second interlayer insulating film 213 and the antenna 201. The wiring 212 and the wiring 216 may be formed using the same material as the source or drain electrode 905 configuring the integrated circuit 211. Note that the coil antenna is used as one electrode of each of the capacitor 217 in the storage capacitor portion 203 and the capacitor 214 in the resonance capacitor portion 204, and the antenna may be wound once or a plurality of times.

Although the antenna is used as one electrode of the capacitor while the wiring is used as the other electrode in this embodiment mode, the invention is not limited to this. A semiconductor film added with impurities or a wiring formed using the same material as the gate electrode may be used as the other electrode of the capacitor.

The aforementioned configuration results in reduction in size of the wireless chip and the IC chip, effective use of a limited area of the chip, reduction in current consumption, and prevention of decrease in communication distance.

Embodiment Mode 2

In this embodiment mode, a wireless chip having a different configuration than that of the aforementioned embodiment mode is described with reference to drawings. Specifically, shown is a configuration where an antenna is used as one of two electrodes of a capacitor while a semiconductor film or a gate wiring is used as the other electrode. Note that in this embodiment mode, the same part as the aforementioned embodiment mode is denoted by the same reference numeral.

Figure 3A:
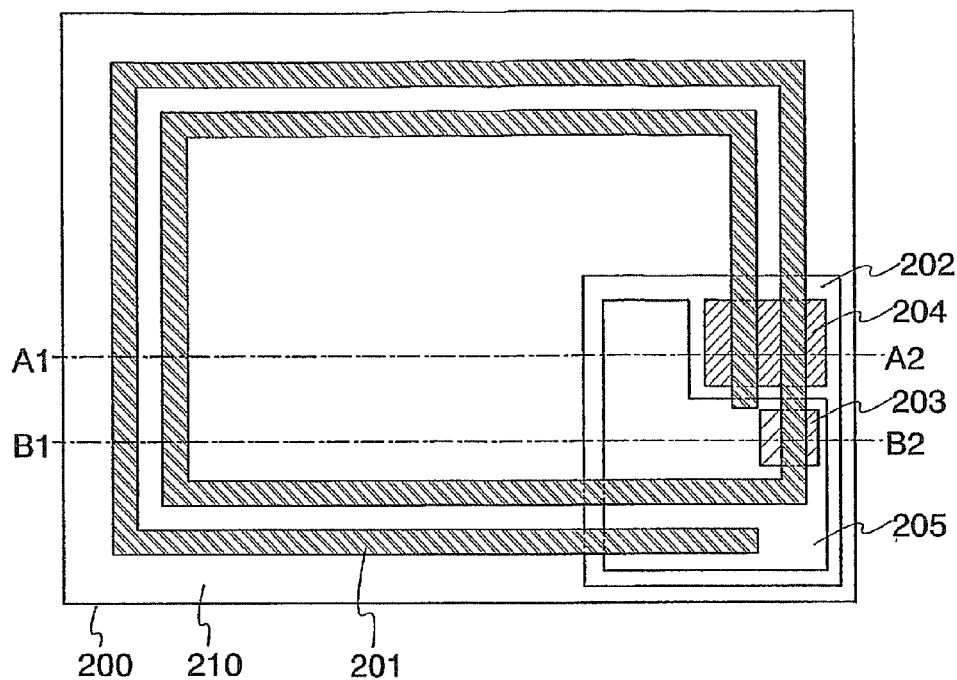
FIGS. 3A to 3C are diagrams each showing a configuration of a wireless chip according to the invention.
Figure 3B:
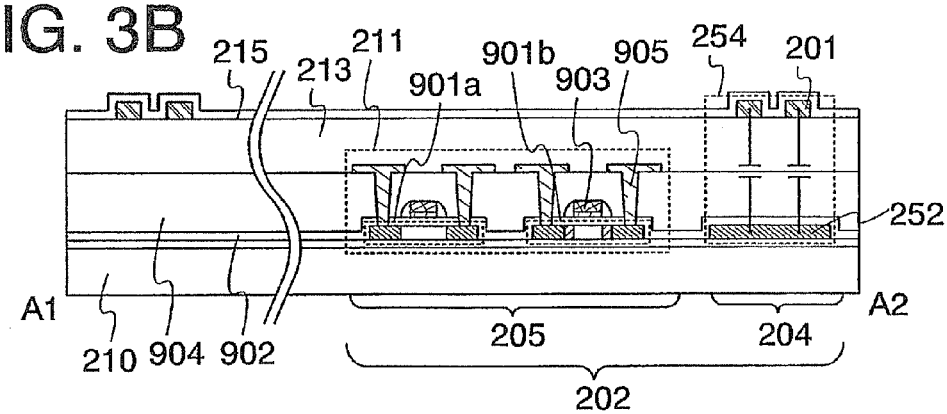

FIG. 3B is a cross sectional view of the resonance capacitor portion 204, where the integrated circuit 211 configuring the logic portion 205, the resonance capacitor portion 204 and the antenna 201 are provided over the substrate 210. Note that FIG. 3B corresponds to a cross section taken along a line A1-A2 of the wireless chip 200 shown in FIG. 3A.

In the resonance capacitor portion 204 shown in FIG. 3B, the antenna 201 and a semiconductor conductive film 252 that is formed using the same material as the impurity regions of the semiconductor films 901a and 901b configuring the integrated circuit 211 are provided with the gate insulating film 902, the first interlayer insulating film 904 and the second interlayer insulating film 213 interposed therebetween. In this manner, capacitance of a capacitor 254 is formed by a stacked structure of the semiconductor conductive film 252, the gate insulating film 902, the first interlayer insulating film 904, the second interlayer insulating film 213, and the antenna 201. That is to say, the antenna 201 is used as one of two electrodes of the capacitor 254, and the semiconductor conductive film 252 is used as the other electrode. Note that FIG. 3B shows a configuration where the semiconductor conductive film 252 is used instead of the wiring 212 shown in FIG. 1B and the capacitor 254 is additionally provided.

As set forth above, the semiconductor conductive film 252 may be used as an electrode of the capacitor 254. The semiconductor conductive film 252 may be formed using the same material as the impurity regions of the semiconductor films 901a and 901b. That is to say, the semiconductor conductive film 252 is formed by adding impurities to the entire surface of the semiconductor film in the resonance capacitor portion 204 at the same time as adding impurities to the semiconductor films 901a and 901b to form a source or drain region and an LDD region.

Figure 3C:
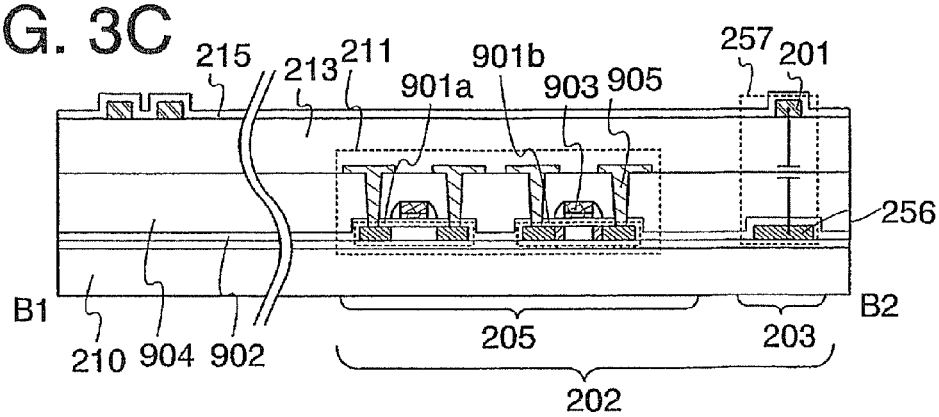

In the storage capacitor portion 203, similarly to in the resonance capacitor portion 204, the antenna 201 is used as one of the two electrodes of the capacitor and a semiconductor conductive film 256 is used as the other electrode, thereby capacitance of a capacitor 257 can be formed (FIG. 3C). In this manner, capacitance of the capacitor 257 is formed by a stacked structure of the semiconductor conductive film 256, the gate insulating film 902, the first interlayer insulating film 904, the second interlayer insulating film 213, and the antenna 201. Note that FIG. 3C shows a configuration where the semiconductor conductive film 256 is used instead of the wiring 216 shown in FIG. 1C and the capacitor 257 is additionally provided.

Figure 4A:
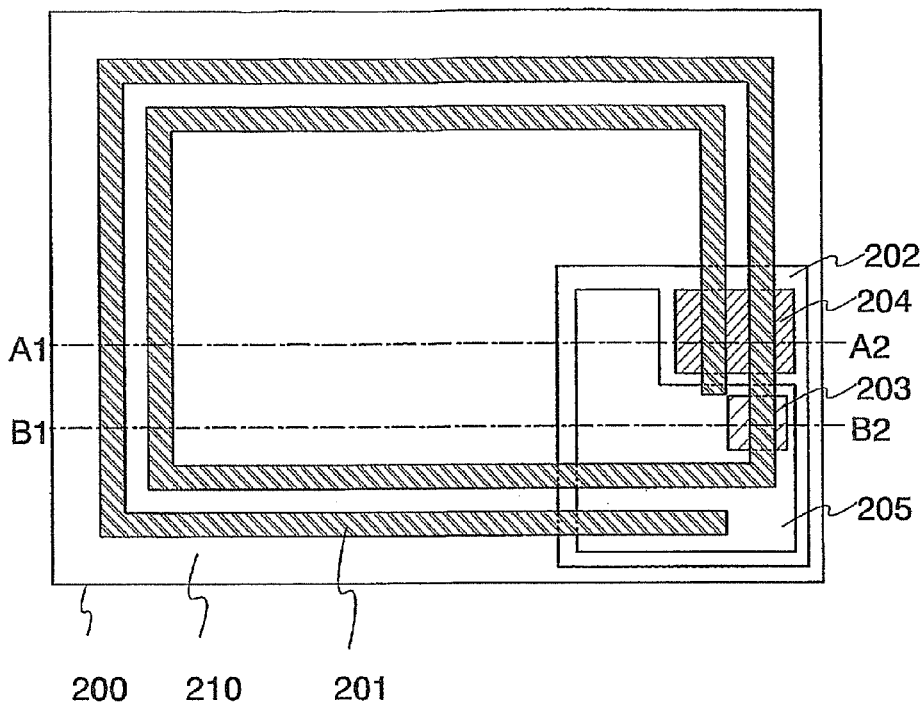
FIGS. 4A to 4C are diagrams each showing a configuration of a wireless chip according to the invention.
Figure 4B:
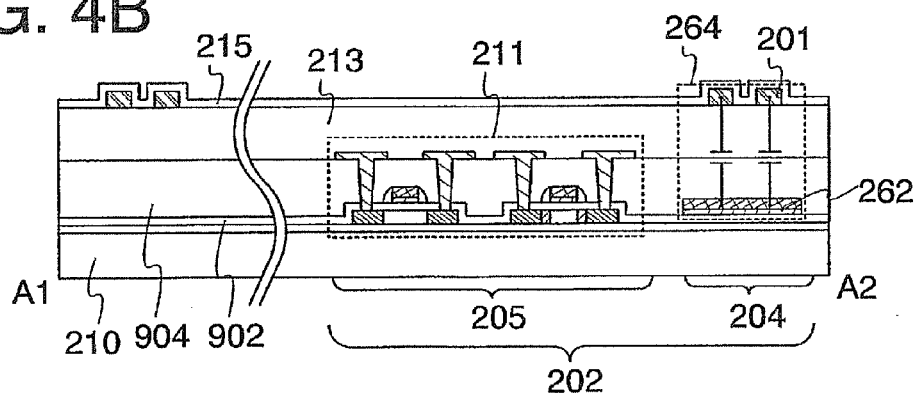
Figure 4C:
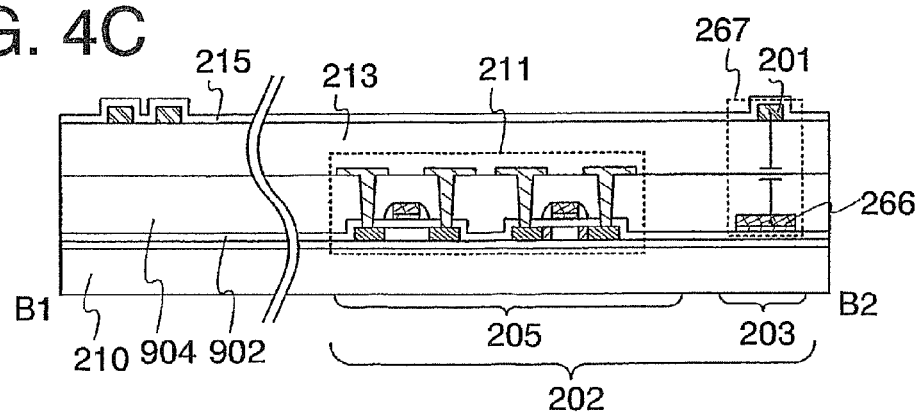

FIGS. 4A to 4C show cases where an antenna is used as one of the two electrodes of each of the capacitors in the resonance capacitor portion 204 and the storage capacitor portion 203, and a wiring formed at the same time as the gate electrode is used as the other electrode.

FIG. 4B shows a configuration where a wiring 262 is used instead of the semiconductor conductive film 252 shown in FIG. 3B, which is one electrode of the capacitor 254. Similarly, FIG. 4C shows a configuration where a wiring 266 is used instead of the semiconductor conductive film 256 shown in FIG. 3C, which is one electrode of the capacitor 257. That is to say, in FIG. 4B, capacitance of a capacitor 264 in the resonance capacitor portion 204 is formed by a stacked structure of the wiring 262 formed using the same material as the gate electrode 903 configuring the integrated circuit, the first interlayer insulating film 904, the second interlayer insulating film 213, and the antenna 201. Meanwhile, in FIG. 4C, capacitance of a capacitor 267 in the storage capacitor portion 203 is formed by a stacked structure of the wiring 266 formed using the same material as the gate electrode 903 configuring the integrated circuit, the first interlayer insulating film 904, the second interlayer insulating film 213, and the antenna 201. Note that FIGS. 4B and 4C correspond to cross sections taken along lines A1-A2 and B1-B2 of the wireless chip 200 shown in FIG. 4A, respectively.

As set forth above, the wiring 262 and the wiring 266 may be used as the electrodes of the capacitor 264 and the capacitor 267 respectively. Note that the wirings 262 and 266 may be formed of a single layer similarly to the gate electrode 903, or formed by stacking a plurality of metal films Even in the case where the gate electrode 903 is formed by stacking a plurality of metal films, the wirings 262 and 266 may be formed of a single layer or formed by stacking a plurality of metal films similarly to the gate electrode 903.

In this embodiment mode, a capacitor may be formed by combining the aforementioned configurations. That is to say, the antenna 201 may be used as one of two electrodes of each capacitor in the storage capacitor portion 203 and the resonance capacitor portion 204, and the other electrode may be formed by combining any of the wirings and the semiconductor conductive film described in Embodiment Modes 1 and 2.

Figure 5A:
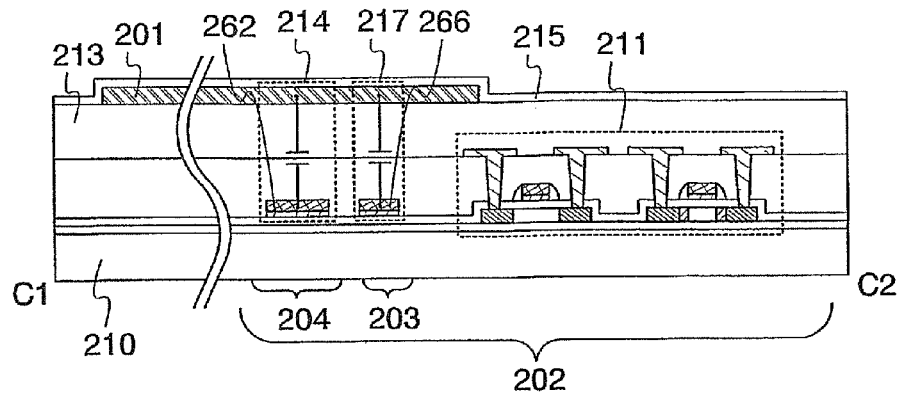
FIGS. 5A to 5C are diagrams each showing a configuration of a wireless chip according to the invention.
Figure 5B:
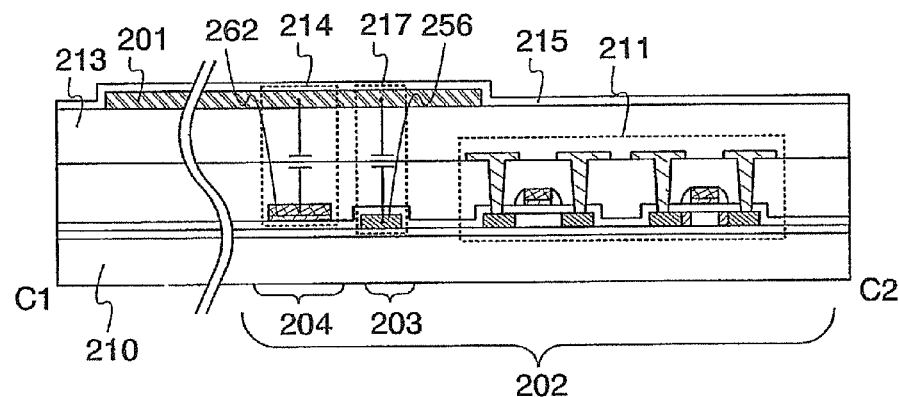
Figure 5C:
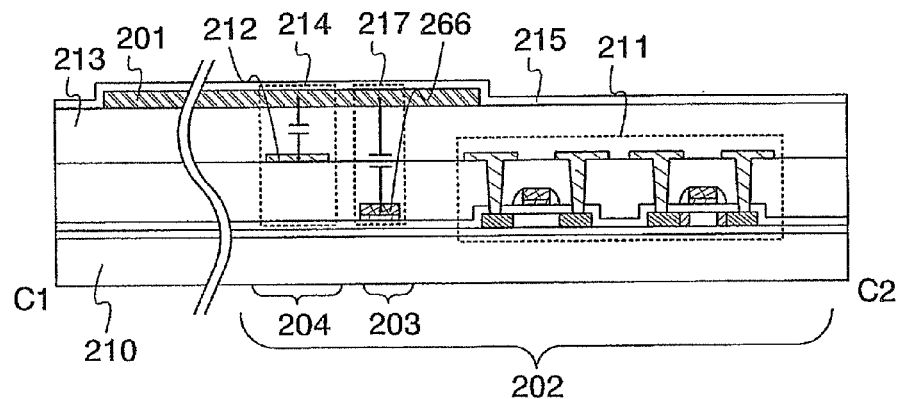

Specifically, the antenna 201 may be used as one electrode of each capacitor in the resonance capacitor portion 204 and the storage capacitor portion 203, and the wirings 262 and 266 may be used as the other electrode (FIG. 5A). Alternatively, the antenna 201 may be used as one electrode of each capacitor in the resonance capacitor portion 204 and the storage capacitor portion 203, and the wiring 262 and the semiconductor conductive film 256 (FIG. 5B), or the wirings 212 and 266 (FIG. 5C) may be used as the other electrode. The aforementioned configurations may be freely combined and arbitrarily selected by a practitioner. Note that FIGS. 5A to 5C correspond to cross sections taken along a line C1-C2 of the wireless chip 200 shown in FIG. 2A.

Figure 15A:
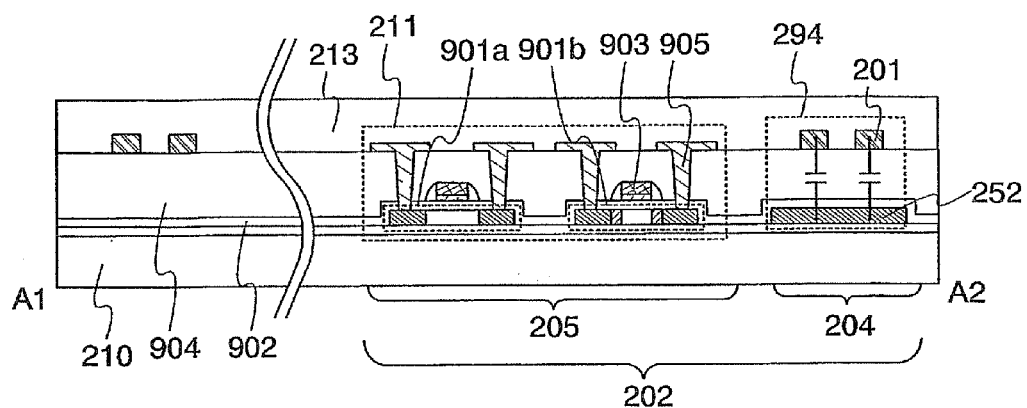
FIGS. 15A and 15B are diagrams each showing a configuration of a wireless chip according to the invention.
Figure 15B:
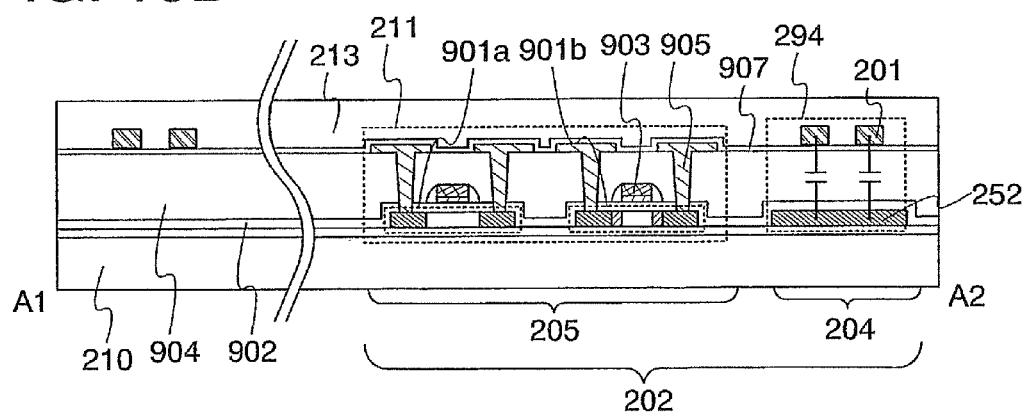

Although the antenna 201 is provided over the second interlayer insulating film 213 in FIGS. 3A to 3C, FIGS. 4A to 4C and FIGS. 5A to 5C, the invention is not limited to this and the antenna 201 may be formed over the first interlayer insulating film 904 (FIGS. 15A and 15B). According to such a configuration, the thickness of the insulating film between two electrodes of a capacitor 294 can be reduced; therefore, the capacitance can be increased. Note that FIG. 15A shows a configuration where the antenna 201 shown in FIG. 3B is provided over the first interlayer insulating film 904. The antenna 201 may be formed over the first interlayer insulating film 904 with an insulating film 907 interposed therebetween (FIG. 15B). In the configuration shown in FIG. 4B also, the antenna may be provided over the first interlayer insulating film 904.

This embodiment mode can be implemented in combination with the aforementioned embodiment mode.

Embodiment Mode 3

Figure 6A:
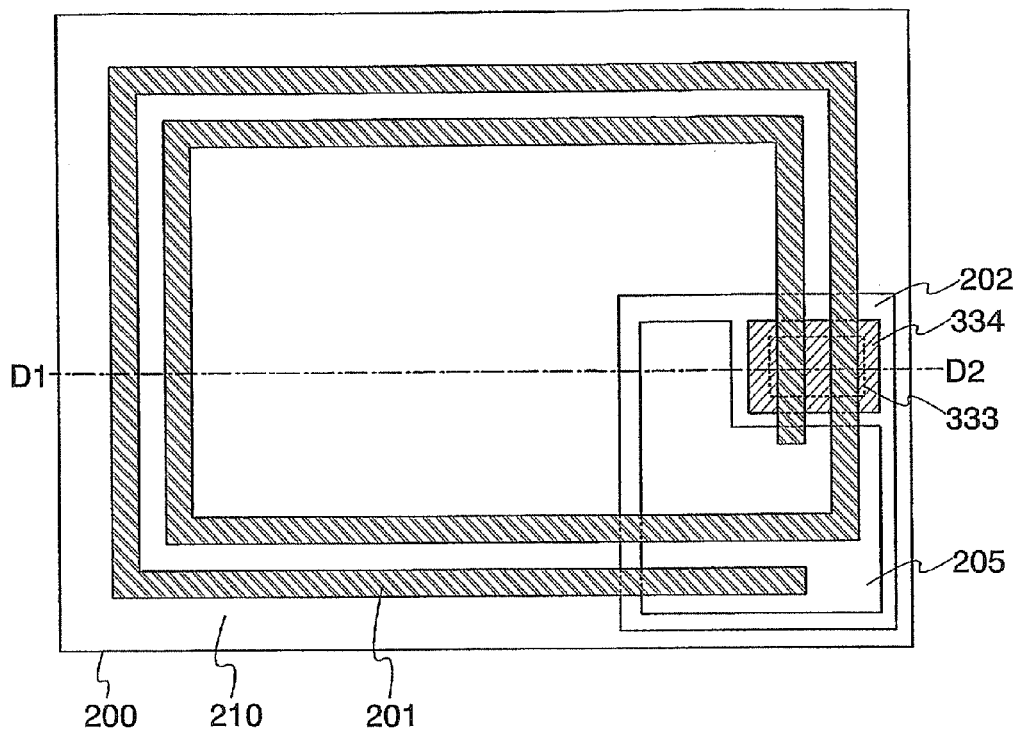
FIGS. 6A and 6B are diagrams each showing a configuration of a wireless chip according to the invention.

Described in this embodiment mode is a configuration where the antenna 201 is used as one of two electrodes of a capacitor in a resonance capacitor portion 334 included in the IC chip 202, and the other electrode is used as one of two electrodes of a capacitor in a storage capacitor portion 333, namely, a configuration where the storage capacitor portion and the resonance capacitor portion overlap each other (FIG. 6A).

Figure 6B:
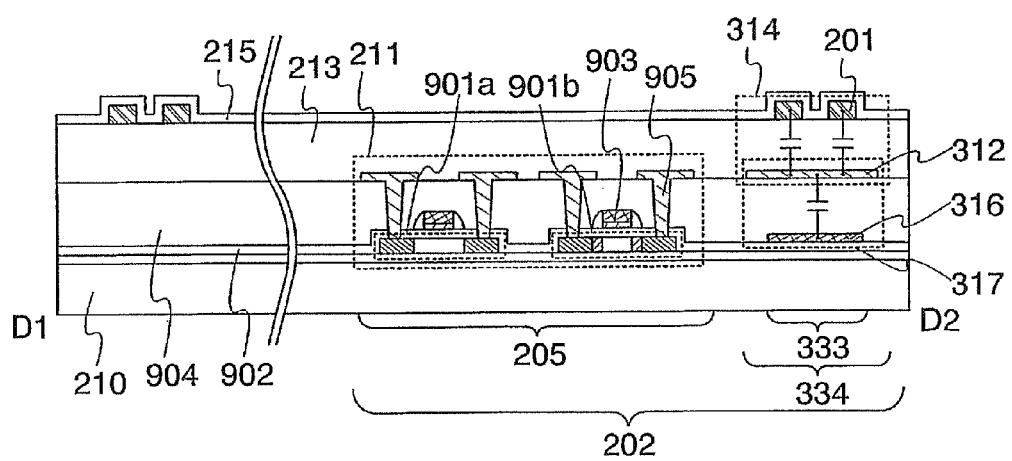

FIG. 6B is a cross sectional view of a stacked structure of the storage capacitor portion 333 and the resonance capacitor portion 334, where the integrated circuit 211 configuring the logic portion 205, the storage capacitor portion 333, the resonance capacitor portion 334, and the antenna 201 are provided over the substrate 210. Note that FIG. 6B corresponds to a cross section taken along a line D1-D2 of the wireless chip 200 shown in FIG. 6A.

In FIG. 6B, a wiring 316 and a wiring 312 are provided with the first interlayer insulating film 904 interposed therebetween, and capacitance of a capacitor 317 in the storage capacitor portion 333 is formed by a stacked structure of the wiring 316, the first interlayer insulating film 904 and the wiring 312. Further in this embodiment mode, the wiring 312 and the antenna 201 are provided with the second interlayer insulating film 213 interposed therebetween, and capacitance of a capacitor 314 in the resonance capacitor portion 334 is formed by a stacked structure of the wiring 312, the second interlayer insulating film 213 and the antenna 201.

The wiring 316 and the wiring 312 may be formed using the same material as a gate electrode and a source or drain electrode respectively, which constitute the integrated circuit 211.

This embodiment mode is not limited to the aforementioned configuration, and other elements may be used as one electrode of the capacitor in the storage portion 333 instead of the wiring 316. Such a case is shown in FIGS. 7A and 7B.

Figure 7A:
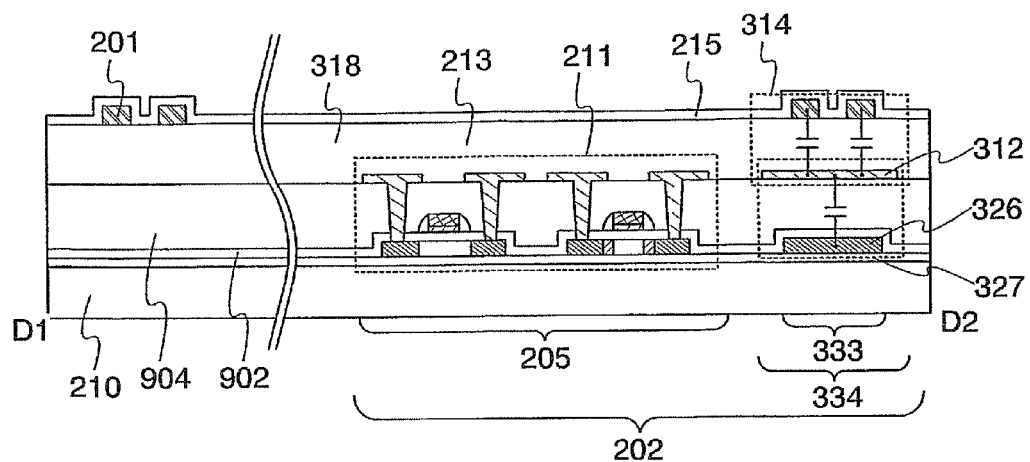
FIGS. 7A and 7B are diagrams each showing a configuration of a wireless chip according to the invention.

FIG. 7A shows a configuration where a semiconductor conductive film 326 is formed instead of the wiring 316 shown in FIG. 6B. In FIG. 7A, capacitance of a capacitor 327 in the storage capacitor portion 333 is formed by a stacked structure of the semiconductor conductive film 326, the first interlayer insulating film 904 and the wiring 312. The semiconductor conductive film 326 may be formed using the same material as impurity regions of a semiconductor film constituting the integrated circuit 211.

Figure 7B:
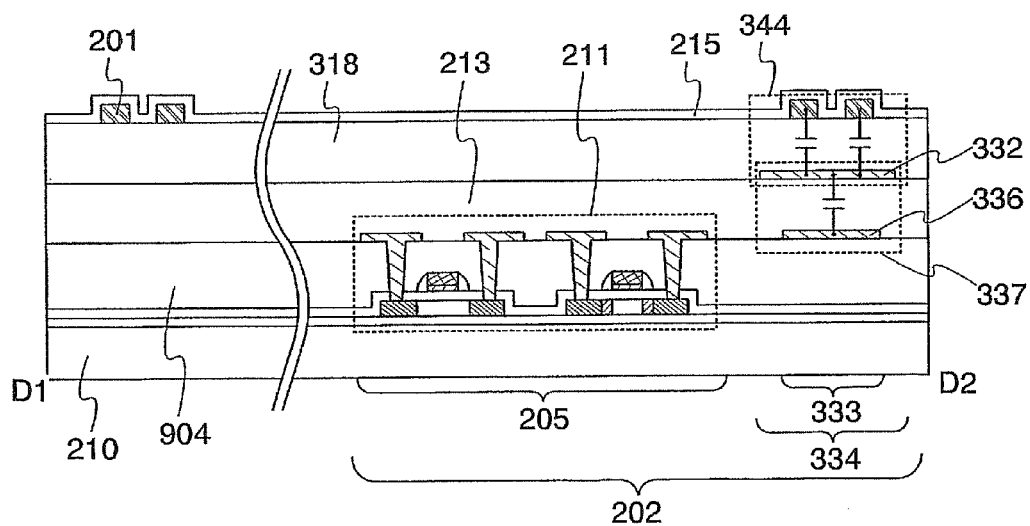
Figure 8A:
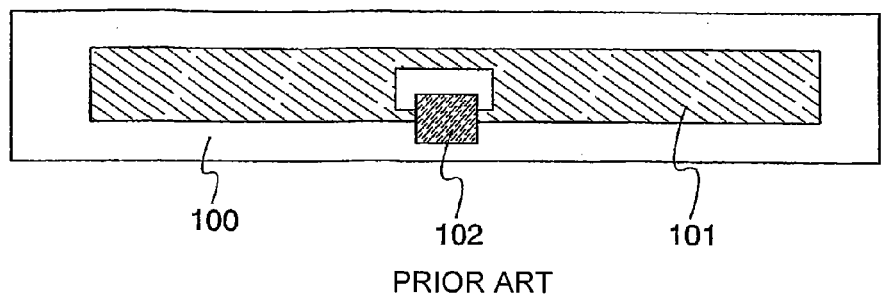
FIGS. 8A and 8B are diagrams each showing a configuration of a wireless chip according to the prior art.
Figure 8B:
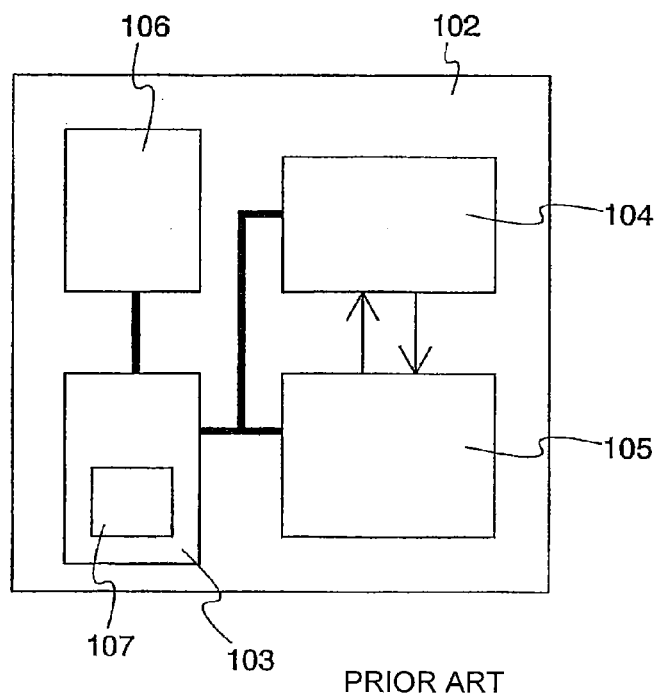

FIG. 7B shows a configuration where a wiring 336 is formed over the first interlayer insulating film 904, a wiring 332 is formed over the second interlayer insulating film 213, and a third interlayer insulating film 318 is formed over the second interlayer insulating film 213 to cover the wiring 332. In FIG. 7B, the wiring 336 and the wiring 332 are provided with the second interlayer insulating film 213 interposed therebetween, and capacitance of a capacitor 337 in the storage capacitor portion 333 is formed by a stacked structure of the wiring 336, the second interlayer insulating film 213 and the wiring 332. Further, the wiring 332 and the antenna 201 are provided with the third interlayer insulating film 318 interposed therebetween, and capacitance of a capacitor 344 in the resonance capacitor portion 334 is formed by a stacked structure of the wiring 332, the third interlayer insulating film 318 and the antenna 201. The wiring 336 may be formed using the same material as the source or drain electrode constituting the integrated circuit 211.

The aforementioned configuration results in reduction in size of the wireless chip and the IC chip, effective use of a limited area of the chip, reduction in current consumption, and prevention of decrease in communication distance.

This embodiment mode can be implemented in combination with any of the aforementioned embodiment modes.

Embodiment Mode 4

Figure 14A:
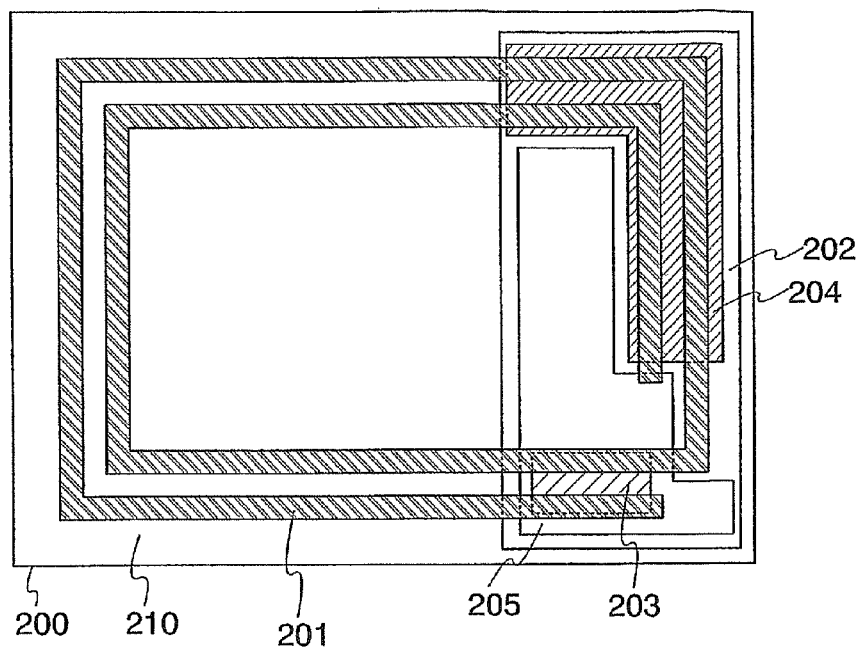
FIGS. 14A and 14B are diagrams each showing a configuration of a wireless chip according to the invention.
Figure 14B:
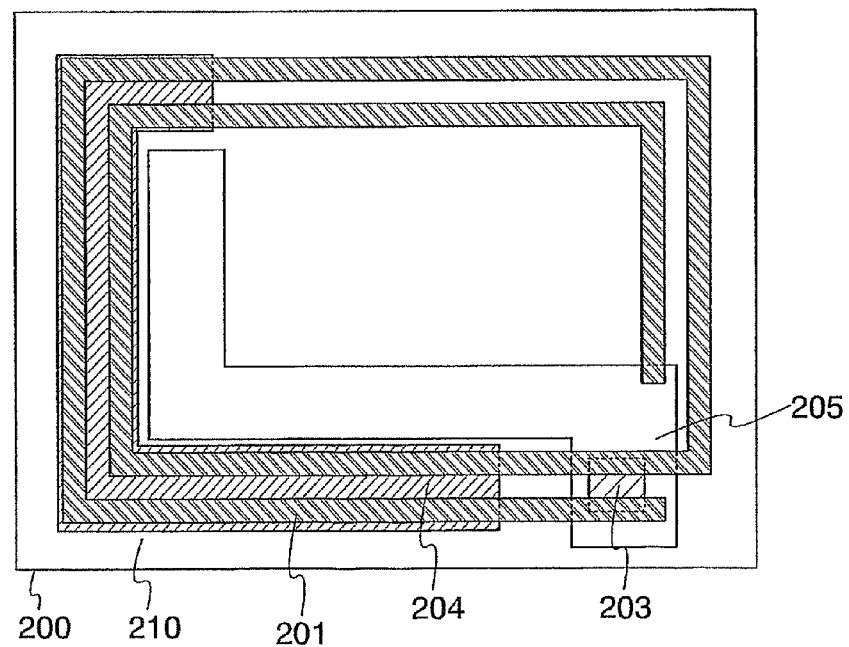

In this embodiment mode, a configuration of a wireless chip where an antenna and an IC chip are arranged in a different manner than that shown in the aforementioned embodiment modes is described with reference to FIGS. 14A and 14B.

The antenna 201 and the IC chip 202 in the wireless chip 200 are arranged in the same manner in the aforementioned embodiment modes (FIGS. 1A to 1C, FIGS. 2A and 2B, FIGS. 3A to 3C, FIGS. 4A to 4C, FIGS. 5A to 5C, FIGS. 6A and 6B, and FIGS. 7A and 7B), though the invention is not limited to this, and the antenna 201 and the IC chip 202 may be arranged in an arbitrary manner.

As set forth above, the antenna 201 and the IC chip 202 are provided to overlap each other in the invention. In that case, if an integrated circuit configuring the IC chip 202 is disposed to overlap the antenna 201, the integrated circuit may malfunction; therefore, a capacitor is selectively provided to overlap the antenna 201 and the integrated circuit is disposed so as not to overlap the antenna 201. In other words, the wireless chip may be formed in an arbitrary manner as long as the antenna and the IC chip overlap each other, and may be formed as shown in FIGS. 14A and 14B, for example.

Specifically, the resonance capacitor portion 204, the storage capacitor portion 203 and the like are provided at the end of the antenna 201 of the wireless chip 200, and the integrated circuit is provided at the center of the wireless chip 200, where the antenna 201 is not formed. In that case, however, the integrated circuit is required to be provided so that magnetic flux due to electromagnetic induction passes easily.

The configuration of the wireless chip where the antenna and the IC chip are provided in the aforementioned manner results in reduction in size of the wireless chip and the IC chip, effective use of a limited area of the chip, reduction in current consumption, and prevention of decrease in communication distance.

Embodiment Mode 5

In this embodiment mode, a configuration of the integrated circuit in the wireless chip, which is different than that shown in the aforementioned embodiment modes is described with reference to FIG. 13.

Figure 13:
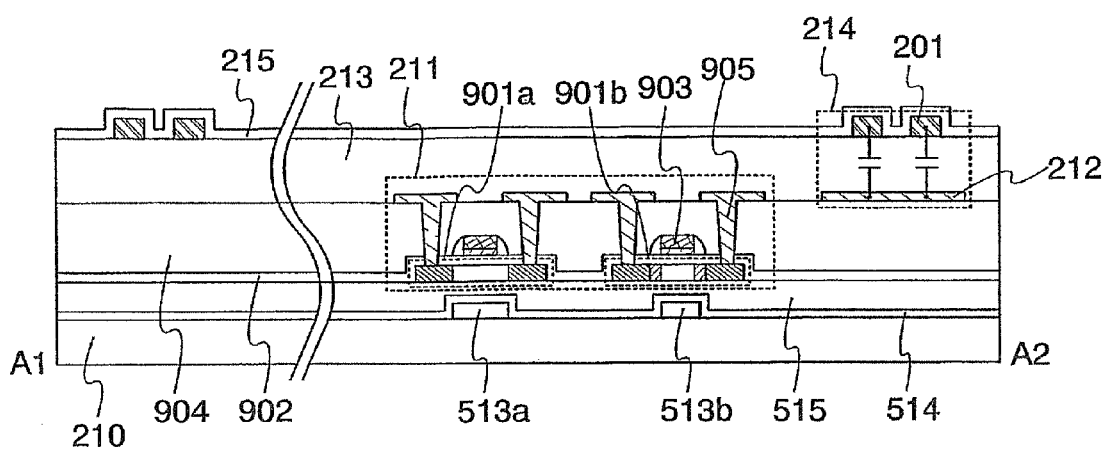
FIG. 13 is a diagram showing a configuration of a wireless chip according to the invention.

FIG. 13 shows a configuration where a bottom electrode is provided in addition to the configuration of the integrated circuit 211 shown in FIG. 1B. That is to say, in FIG. 13, the channel regions of the semiconductor films 901a and 901b are provided between bottom electrodes 513a and 513b and the gate electrode 903 with insulating films 514 and 515 and the insulating film 902 interposed therebetween, respectively.

The bottom electrodes 513a and 513b may be formed of a metal or a polycrystalline semiconductor added with impurities having one conductivity type. As the metal, W, Mo, Ti, Ta, Al and the like may be employed. The silicon nitride film 514 and the silicon oxynitride film 515 are provided as base insulating films, though the material and the stacking order of these films are not limited to this.

Such a configuration including the bottom electrode may be adopted for the integrated circuit 211. In general, the power consumption of the integrated circuit increases with reduction in the size of a TFT and increase in the clock frequency for operating the circuit. Accordingly, a bias voltage is preferably applied to the bottom electrode in order to prevent increase in power consumption. By changing the bias voltage, the threshold voltage of the TFT can be changed.

When a negative bias voltage is applied to the bottom electrode of an N-channel TFT, threshold voltage increases and leakage current decreases. On the other hand, when a positive bias voltage is applied to the bottom electrode of the N-channel TFT, threshold voltage decreases, current easily flows to a channel region, and the TFT operates at a higher rate or a lower voltage. When a bias voltage is applied to the bottom electrode of a P-channel TFT, the opposite effect is obtained. Accordingly, by controlling a bias voltage applied to the bottom electrode, the characteristics of the integrated circuit can be significantly improved.

The characteristics of the integrated circuit can be improved by controlling the threshold voltage of an N-channel TFT and a P-channel TFT using such a bias voltage. At this time, both a power supply voltage and the bias voltage applied to the bottom electrode may be controlled to reduce power consumption. A high reverse bias voltage is applied when a circuit is in a standby mode, a low reverse bias voltage is applied when the circuit is in an operating mode and lightly loaded, and a low forward bias voltage is applied when the circuit is in an operating mode and heavily loaded. Switching of the bias voltage may be performed by a control circuit depending on the operating state of the circuit or the state of load. The power consumption and characteristics of the TFT can be controlled in this manner, leading to the best performance of the circuit.

This embodiment mode can be implemented in combination with any of the aforementioned embodiment modes.

Embodiment Mode 6

Figure 10:
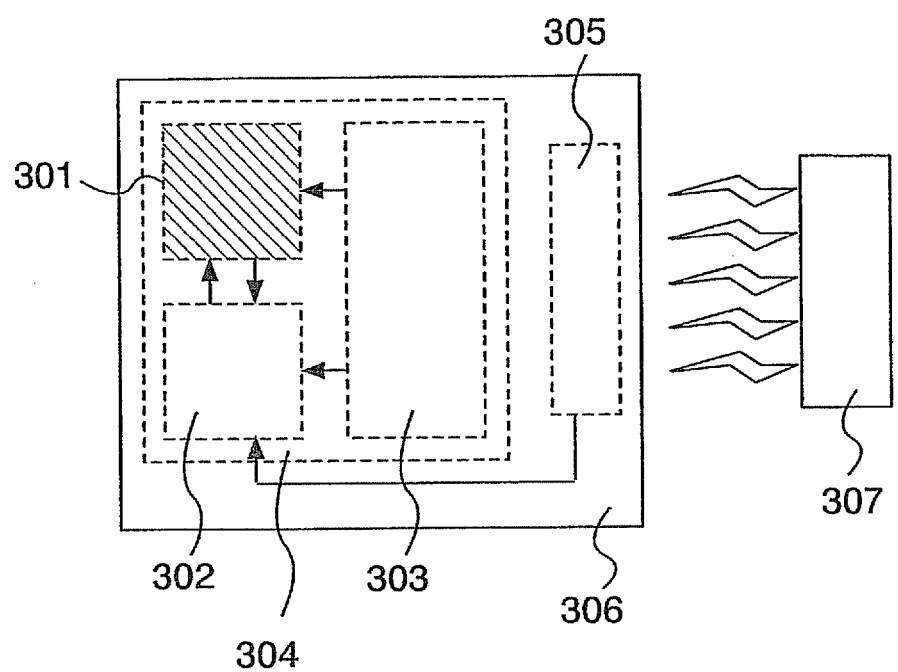
FIG. 10 is a diagram showing a configuration of a wireless chip according to the invention.

Communication steps using a wireless chip 306 of the invention is briefly described below (FIG. 10). In FIG. 10, an antenna 305 does not overlap an IC chip 304 for convenience, though they overlap each other in practice as described in the invention. First, the antenna 305 included in the wireless chip 306 receives radio waves from a reader/writer 307. Then, electromotive force is generated in a power supply generating means 303 by the effect of resonance. An IC chip 304 included in the wireless chip 306 is activated, so that data in a memory means 301 is converted into signals by a control means 302. Subsequently, signals are transmitted from the antenna 305 included in the wireless chip 306, and the transmitted signals are received by the reader/writer 307. The received signals are transmitted to a data processing device via a controller included in the reader/writer 307 and processed by software. Note that the aforementioned communication steps adopt an electromagnetic induction method that uses magnetic flux generated between a coil antenna of the wireless chip and a coil antenna of the reader/writer, though the invention may adopt a microwave method as well.

The wireless chip 306 is advantageous in that data is communicated wirelessly, a plurality of signals can be read, data can be written, it can be formed into various shapes, it has wide directivity and recognition range depending on a selected frequency, and the like. The wireless chip 306 can be applied to an IC tag capable of identifying data on an individual or an object by wireless communication, a label formed to be attached to an object, a wristband for an event or an amusement park, and the like. The wireless chip 306 may be molded using a resin material, or directly attached to a metal that blocks wireless communication. In addition, the wireless chip 306 can be applied to the operation of a system such as a management system for entering and leaving a room and an account system.

Figure 11A:
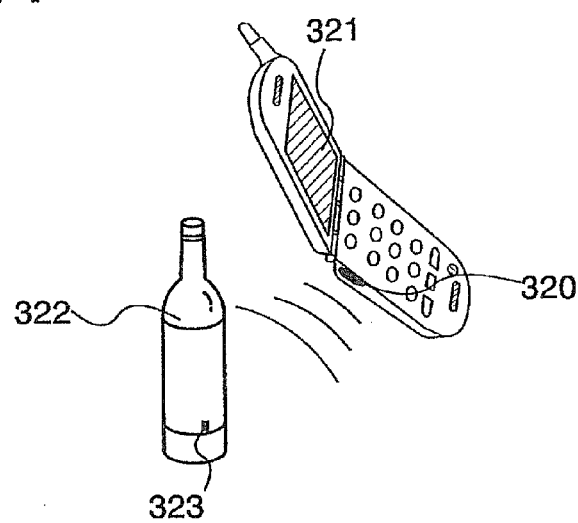
FIGS. 11A and 11B are diagrams each showing an object incorporating a wireless chip according to the invention.
Figure 11B:
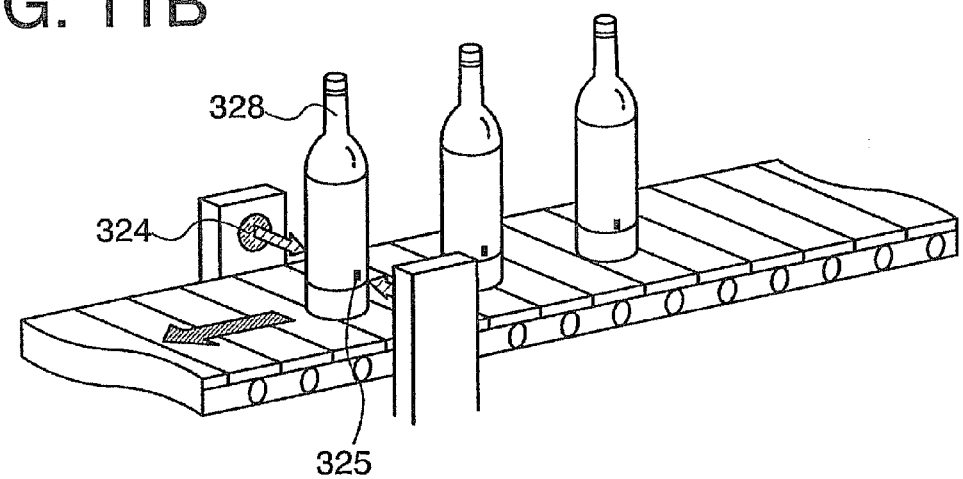

Next, an example of the practical use of the wireless chip 306 is described. A reader/writer 320 is provided on a side of a portable terminal having a display portion 321, and a wireless chip 323 is provided on a side of an object 322 (FIG. 11A). When the reader/writer 320 is brought close to the wireless chip 323 included in the object 322, data on the object such as ingredients, place of origin, test result in each production step, history of the distribution process, and explanation of the object is displayed on the display portion 321. Besides, an object 328 can be tested using a reader/writer 324 and a wireless chip 325 included in the object 328 while the object 328 is carried on a conveyor belt (FIG. 11B). By applying the wireless chip to the system in this manner, data can be obtained easily and high performance and high added value can be achieved.

This embodiment mode can be implemented in combination with any of the aforementioned embodiment modes.

Embodiment Mode 7

Described in this embodiment mode are applications of the wireless chip shown in the aforementioned embodiment modes. A wireless chip 250 may be incorporated in, for example, bills, coins, securities, bearer bonds, certificates (license, resident card and the like, FIG. 12A), containers for wrapping objects (wrapping paper, bottle and the like, FIG. 12B), recording media such as DVDs, CDs, and video tapes (FIG. 12C), vehicles such as cars, motorbikes and bicycles (FIG. 12D), belongings such as bags and glasses (FIG. 12E), foods, clothes, livingware, electronic apparatuses, and the like. The electronic apparatuses include a liquid crystal display device, an EL display device, a television set (also simply called a television or a television receiver), a mobile phone set, and the like.

Note that the wireless chip may be attached to the surface of the object or incorporated in the object to be fixed. For example, the wireless chip may be incorporated in a paper of a book, or an organic resin of a package. When the wireless chip is incorporated in bills, coins, securities, bearer bonds, certificates, and the like, forgery thereof can be prevented. When the wireless chip is incorporated in containers for wrapping objects, recording media, belongings, foods, clothes, livingware, electronic apparatuses, and the like, test system, rental system and the like can be performed more efficiently. The wireless chip also prevents vehicles from being forged or stolen. In addition, when the wireless chip is implanted into creatures such as animals, each creature can be identified easily. For example, when the wireless chip is implanted into creatures such as domestic animals, year of birth, sex, breed and the like thereof can be identified easily.

As set forth above, the wireless chip of the invention can be incorporated in any of objects (including creatures). This embodiment mode can be implemented in combination with any of the aforementioned embodiment modes.

The present application is based on Japanese Priority application No. 2004-263111 filed on Sep. 9, 2004 with the Japanese Patent Office, the entire contents of which are hereby incorporated by reference.

What is claimed is:

1. A semiconductor device comprising:
an IC chip comprising:
a transistor comprising a source region;
an insulating film over the transistor;
a first wiring over and in contact with the insulating film, the first wiring being electrically connected to the source region; and
a second wiring over and in contact with the insulating film, the second wiring comprising a same material as the first wiring; and
an antenna over the IC chip, the antenna comprising a conductive film,
wherein a portion of the conductive film overlaps with the second wiring in a direction perpendicular to a plane of the IC chip, and
wherein the second wiring and the portion of the conductive film form a capacitor element.

2. A semiconductor device according to claim 1, wherein the transistor is a thin film transistor.

3. A semiconductor device according to claim 1, wherein the antenna has a coil shape.

4. A semiconductor device comprising:
an IC chip comprising:
a transistor comprising a gate electrode over and in contact with a gate insulating film; and
a wiring over and in contact with the gate insulating film, the wiring comprising a same material as the gate electrode; and
an antenna over the IC chip, the antenna comprising a conductive film,
wherein a portion of the conductive film overlaps with the wiring in a direction perpendicular to a plane of the IC chip, and
wherein the wiring and the portion of the conductive film form a capacitor element.

5. A semiconductor device according to claim 4, wherein the transistor is a thin film transistor.

6. A semiconductor device according to claim 4, wherein the antenna has a coil shape.

7. A semiconductor device comprising:
an IC chip comprising:
a logic portion comprising:
a transistor comprising a gate electrode over and in contact with a gate insulating film;
a first wiring over and in contact with the gate insulating film, the first wiring comprising a same material as the gate electrode; and
a second wiring over and in contact with the gate insulating film, the second wiring comprising the same material as the gate electrode; and
an antenna over the IC chip, the antenna comprising a conductive film,
wherein first and second portions of the conductive film overlap with the first wiring and the second wiring in a direction perpendicular to a plane of the IC chip,
wherein a part of the first wiring and the first portion of the conductive film form a resonance capacitor portion, and
wherein a part of the second wiring and the second portion of the conductive film form a storage capacitor portion.

8. A semiconductor device according to claim 7, wherein the transistor is a thin film transistor.

9. A semiconductor device according to claim 7, wherein the antenna has a coil shape.

10. A semiconductor device comprising:
an IC chip comprising:
a transistor comprising a gate electrode over and in contact with a gate insulating film, the transistor further comprising a source region;
an interlayer insulating film over the transistor;
a first wiring over and in contact with the interlayer insulating film, the first wiring being electrically connected to the source region;
a second wiring over and in contact with the gate insulating film, the second wiring comprising a same material as the gate electrode; and
a third wiring over and in contact with the interlayer insulating film, the third wiring comprising a same material as the first wiring; and
an antenna comprising a conductive film, first and second portions of the conductive film overlapping with the second wiring and the third wiring in a direction perpendicular to a plane of the IC chip,
wherein the second wiring and the first portion of the conductive film form a capacitor element.

11. A semiconductor device according to claim 10, wherein the transistor is a thin film transistor.

12. A semiconductor device according to claim 10, wherein the antenna has a coil shape.

* * * * *